United States Patent [19]

Takenouchi et al.

[11] Patent Number: 5,061,649
[45] Date of Patent: Oct. 29, 1991

[54] FIELD EFFECT TRANSISTOR WITH LIGHTLY DOPED DRAIN STRUCTURE AND METHOD FOR MANUFACTURING THE SAME

[75] Inventors: Naoko Takenouchi, Tokyo; Katsuhiko Hieda, Yokohama, both of Japan

[73] Assignee: Kabushiki Kaisha Toshiba, Kawasaki, Japan

[21] Appl. No.: 29,954

[22] Filed: Mar. 25, 1987

[30] Foreign Application Priority Data

Mar. 31, 1986 [JP] Japan .................................. 61-71158

[51] Int. Cl.$^5$ .......................................... H01L 21/265
[52] U.S. Cl. ......................................... 437/44; 437/40; 437/41; 437/154; 357/23.3; 357/23.4
[58] Field of Search .............. 437/27, 28, 29, 30, 437/40, 41, 44, 149, 150, 152, 153, 154, 23.1; 357/23.3, 23.4, 23.11, 91; 156/643

[56] References Cited

U.S. PATENT DOCUMENTS

| | | | |
|---|---|---|---|
| 4,172,260 | 10/1979 | Okabe et al. | 437/44 |
| 4,356,623 | 11/1982 | Hunter | 437/44 |
| 4,613,882 | 9/1986 | Pimbley et al. | 437/44 |
| 4,680,603 | 7/1987 | Wei et al. | 437/44 |
| 4,746,624 | 5/1988 | Cham et al. | 437/44 |

FOREIGN PATENT DOCUMENTS

| | | |
|---|---|---|
| 2753613 | 3/1987 | Fed. Rep. of Germany . |
| 4810268 | 4/1973 | Japan . |
| 52-135685 | 11/1977 | Japan . |
| 54-44482 | 4/1979 | Japan . |
| 58-153370 | 9/1983 | Japan . |
| 0096768 | 6/1984 | Japan .................................. 357/23.3 |
| 0136376 | 7/1984 | Japan . |
| 0171003 | 2/1986 | Japan .................................. 357/23.3 |
| 0214473 | 9/1986 | Japan .................................. 357/23.3 |

OTHER PUBLICATIONS

Grinolds et al., "Reliability and Performance of Submicron LDD MOSFETs' with Buried-As N-Impurity Profiles", IEDM 12/1985, pp. 246-249.

Wada et al., "A Study of Hot-Carrier Degradation in Optimized 1 μm LDD-MOSFET Using Device Simulator", presented at the 45th Japanese Applied Physics Conference, Oct. 12-15, 1984.

Primary Examiner—Olik Chaudhuri
Assistant Examiner—M. Wilczewski
Attorney, Agent, or Firm—Oblon, Spivak, McClelland, Maier & Neustadt

[57] ABSTRACT

A semiconductor integrated circuit device is disclosed which has an MOSFET with a lightly doped drain or LLD structure. A gate electrode layer is insulatively provided above a semiconductor substrate of p conductivity type. Source and drain layers of n conductivity type are formed in the substrate in such a manner as to be substantially self-aligned with the gate electrode. Each of these source and drain layers is comprised of a heavily doped diffusion layer and a lightly doped diffusion layer. The n− diffusion layer is deep enough to fully surround the heavily doped layer in the substrate. The n− diffusion layer has a step-like cross-section, whereby the effective channel length of MOSFET is increased inside the substrate to increase the punch-through voltage level.

4 Claims, 3 Drawing Sheets

FIELD EFFECT TRANSISTOR WITH LIGHTLY DOPED DRAIN STRUCTURE AND METHOD FOR MANUFACTURING THE SAME

BACKGROUND OF THE INVENTION

This invention relates to a semiconductor device microminiaturized by a submicron fabrication technique and, in particular, a high packing density semiconductor integrated circuit having field effect transistors of submicron size and a method for manufacturing the same.

With a recent advance in the microminiaturizing technology, semiconductor IC (integrated circuit) devices have been manufactured with field effect transistors formed in a chip substrate and their effective channel length defined on the order of submicron size. The submicron fabricating technique is the most promising, basic technical approach to satisfying an unending desire for the improvement of a semiconductor memory integration. Various techniques have been developed to implement a microminiaturized transistor pattern on a chip substrate, while securing high reliability and high yield.

The microminiaturization of transistors in the semiconductor device involves various problems of, for example, degrading a basic device performance. The submicron field effect transistors, such as metal oxide semiconductor field effect transistors (hereinafter referred to as MOSFETs) suffer from the drawbacks of involving a punch-through phenomenon across a source-to-drain circuit and of lowering a junction breakdown voltage on active layers acting as a source and drain. In the microminiaturized MOSFETs, an effective channel length is short due to a short source-to-drain distance. With an increasing voltage applied to the active layers, depletion layers around the active layers are enlarged in the semiconductive substrate. When the voltage applied exceeds a certain level, the depletion layers become joined together. In such a punch-through state, the basic transistor action is impeded. Where the effective channel length is short on the order of submicron size, the punch-through phenomenon is more liable to occur in an extremely prominent fashion, posing a serious problem to the microminiaturized MOSFETs.

With the impurity concentration of the substrate set at a high level, it is possible to suppress the extending of the depletion layers around the active layer in the substrate, and thus minimizing the generation of the aforementioned punch-through phenomenon. In this case, however, an impurity concentration difference between the active layer and the substrate becomes naturally larger, resulting in another problem of decreasing the junction breakdown voltage at the source and the drain. If the junction breakdown voltage on the MOSFETs is degraded, the operation margin of the MOSFET is lowered, thereby degrading the basic performance of the IC device.

In consideration of these factors, it has recently been proposed to provide MOSFETs having a lightly doped drain structure which is known in the art as an LDD structure. According to this structure, the lightly doped semiconductor layers of the same conductivity type as those of the active layers are formed around the periphery of the active layers (the source and drain) in the substrate. These layers have an impurity concentration level which is lower than those of the active layers. Even in the semiconductor devices of this structure, however, it has been difficult to solve the aforementioned conflicting problems at once, since, if the lightly doped layer is so formed as to be partially joined to each active layer at a channel region, it is not possible to suppress the lowering of a junction breakdown voltage on a location between the lightly doped layer and the remaining portion of the active layer. If, on the other hand, the lightly doped layer is so formed as to fully surround each active layer, then the occurrence of the punch-through phenomenon cannot be properly suppressed to a desired extent since the junction depth of the lightly doped layer is greater.

SUMMARY OF THE INVENTION

An object of this invention is to provide a novel and improved semiconductor device of submicron size which not only can effectively suppress a punch-through phenomenon, but also can raise the junction breakdown voltage on a source and drain of the device.

Another object of this invention is to provide a method for better manufacturing a micro-fabricated semiconductor device which not only can effectively suppress a punch-through phenomenon, but also can raise a junction breakdown voltage on a source and drain of the device.

In accordance with the above object, this invention is addressed to a specific semiconductor device which includes a field effect transistor with a lightly doped drain structure. The transistor is formed in a semiconductive substrate of a first conductivity type.

A conductive layer is insulatively provided above the substrate to serve as a gate electrode of the transistor. Two semiconductor active layers of a second conductivity type are formed in the substrate in such a manner that they are substantially self-aligned with the gate layer to serve as source and drain layers of the transistor.

At least the drain layer is comprised of a heavily doped semiconductor layer and a lightly doped semiconductor layer of the second conductivity type. The lightly doped layer is formed in the substrate to surround the heavily doped layer. The lightly doped layer has a step-like cross-section, whereby an effective channel length of the transistor is increased inside the substrate, so that the generation of a punch-through phenomenon may be minimized in the field effect transistor.

The lightly doped semiconductor layer is comprised of first and second diffusion layers which are separately formed in the substrate, by subsequently performing ion implantations, so as to be overlapped with each other, so that the step-like cross-sectional shape of the lightly doped layer is easily fabricated without the use of any special process.

The invention, and its objects and advantages, will become more apparent in the detailed description of a preferred embodiment presented below.

BRIEF DESCRIPTION OF THE DRAWINGS

In the detailed description of a preferred embodiment of this invention presented below, reference is made to the accompanying drawings in which.

DETAILED DESCRIPTION OF THE PREFERRED EMBODIMENT

Figure 1:
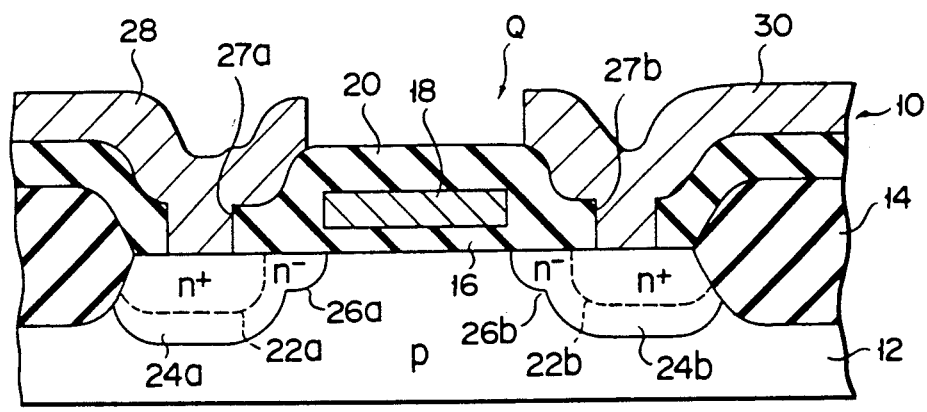
FIG. 1 is a major cross-sectional view, not drawn to scale, showing a semiconductor IC (integrated circuit) device according to one preferred embodiment of this invention, which includes metal oxide semiconductor field effect transistors.

Referring now to FIG. 1, semiconductor substrate 12 of semiconductor IC device 10 is comprised of a silicon substrate of a p conductivity type. Field oxide film 14 formed of an oxide silicon layer is so formed that a metal oxide semiconductor field effect transistor (hereinafter referred to as a MOSFET) area is defined in substrate 12. Gate oxide or insulating film 16 is formed in the substrate portion within the transistor area. Gate oxide film 16 has a thickness of, for example, 20 mm. Gate electrode layer 18 of the MOSFET is formed on gate oxide film 16 and formed of polysilicon. Oxide layer 20 is formed in a manner to surround gate electrode 18.

Heavily doped semiconductor layers 22a and 22b of a conductivity type (n type) opposite to that of substrate 12 are formed by diffusion in the surface portion of substrate 12. In FIG. 1, the conductivity type of semiconductor layer 22 is indicated by mark "n+" as in accordance with a conventional drawing rule. Semiconductor layers 22a and 22b act as source and drain layers of MOSFET Q.

Lightly doped semiconductor layers 24a and 24b are deeply formed in substrate 12 in a manner to fully surround source and drain layers 22a and 22b. Semiconductor layers 24a and 24b have a conductivity type (n−type) the same as the conductivity type of source and drain layers 22a and 22b. The conductivity type of these layers 24a and 24b are indicated, in FIG. 1, by mark "n−" in accordance with the conventional drawing rule. In FIG. 1 semiconductor layer 22 is indicated by a broken line so as to visually discriminate semiconductor layers 22 and 24 from each other. Semiconductor layer 24 is substantially self-aligned with gate electrode layer 18. Semiconductor layer 24 also serves as the source and drain of MOSFET Q. This MOSFET thus has an LDD structure in which the impurity concentration level of the source and drain layers are high in their inner area and low at their peripheral area. Respective lightly doped semiconductor layer 24 is step-like in cross section as shown in FIG. 1. More specifically, respective semiconductor layer 24 has dimple 26a or 26b formed adjacent each end of the channel region, i.e., at the lower edge of a near-surface bump-like portion thereof located somewhat remote from each end of gate electrode layer 18. Respective lightly doped layer 24 is thus formed to have a step-like cross-section.

Insulating layer 20 has contact holes 27a and 27b to expose the surface portions of source and drain layers 22a and 22b. Metal layers 28 and 30 are formed on insulating layer 20 to be electrically connected respectively through contact holes 27a and 27b to source and drain layers 22a and 22b. Metal layers 28 and 30 serve as source and drain electrodes.

Figure 2A:
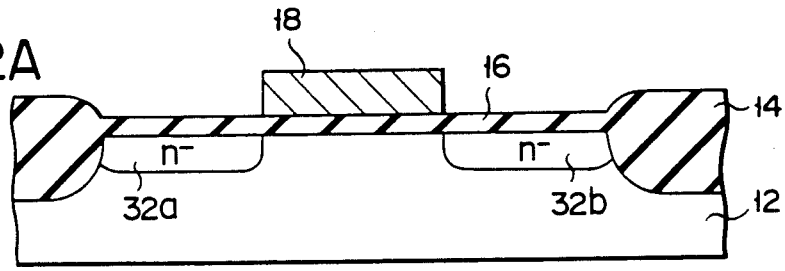
FIGS. 2A to 2E show cross-sectional views sequentially obtained at major steps of the process of manufacturing a semiconductor circuit.
Figure 2B:
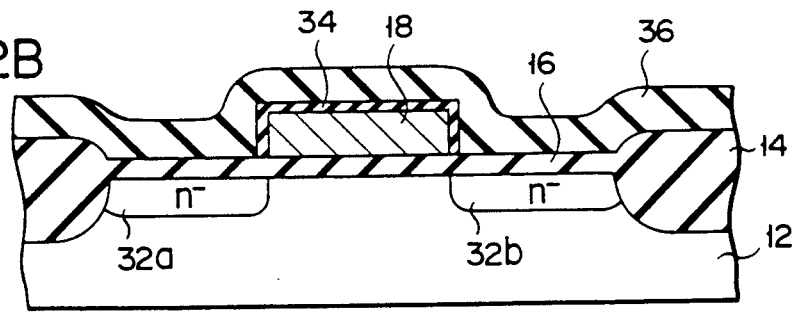

The aforementioned transistor structure may be fabricated using a method as set out below. First of all, as illustrated in FIG. 2A, field insulating layer 14 and gate oxide film 16 are formed on p type silicon substrate 12. Substrate 12 has a relatively high impurity concentration of, for example, $8 \times 10^{16}$ cm$^3$. Gate oxide layer 16 is so formed as to have a thickness of 20 mm in this embodiment. Gate electrode layer 18 is deposited on gate oxide film 16. Gate electrode layer 18 is formed of a polysilicon film having a length of 0.8 μm (800 nm) and thickness of 400 nm.

Subsequently, an n type impurity (phosphorus) is implanted into substrate 12 with gate electrode layer 18 as a mask, noting that the ion implantation is performed at a voltage level of 15 KeV and a dose of $3 \times 10^{13}$ cm$^{-2}$. As a result, n− type diffusion layers (first diffusion layers) 32a and 32b are formed in substrate 12 to be substantially self-aligned with gate electrode layer 18. The structure as shown in FIG. 2A is subjected to heat treatment and insulating film 34 of silicon oxide is formed on the surface of gate electrode layer 18. Then oxide film 36 is formed over the resultant structure by a chemical vapor deposition (CVD) method using a silane gas, to cover layers 14, 16 and 18.

Figure 2C:
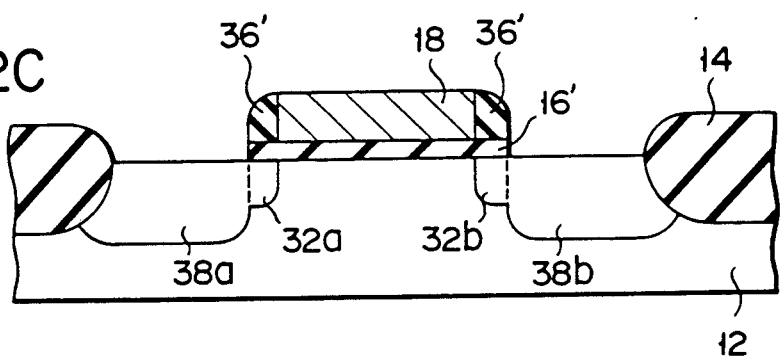

Insulating layers 16, 34 and 36 are etched by an RIE (reactive ion etching) process and, as shown in FIG. 2C, insulating layers 34 and 36 are mostly removed with only their portions left adjacent the ends of gate layer 18 and insulating layer 16 is removed except for the portion beneath gate electrode layer 18. As a result, insulation layer portion 36' is left at each side of gate electrode layer 18 and gate insulating layer portion 16' is left beneath gate electrode layer 18.

With gate electrode layer 18 and insulating layer portion 36 as a mask, an n− type impurity (phosphorus) is injected into substrate 12, preferably at an acceleration voltage of 60 KeV and at a dose of $3 \times 10^{13}$/cm$^{-2}$. It should be noted that the acceleration voltage is set higher than, for example, at four times (in this case), the acceleration voltage at the step of forming n− type diffusion layers (first diffusion layers) 32a and 32b through ion implantation. As a result, n− type diffusion layers 38a and 38b (second diffusion layers) formed in substrate 12 are deeper than diffusion layers 32a and 32b which are formed previously. Deep n− diffusion layers 38a and 38b are formed in substrate 12 in a manner to overlap with shallow n− diffusion layers 32a and 32b. Shallow n− diffusion layers 32a and 32b are substantially self-aligned with gate electrode layer 18, while, on the other hand, deep diffusion layers 38a and 38b are substantially self-aligned with insulating layer portions 36'. First and second diffusion layers 32 and 38 act as lightly doped layers 24 of MOSFET Q of FIG. 1.

Figure 2D:
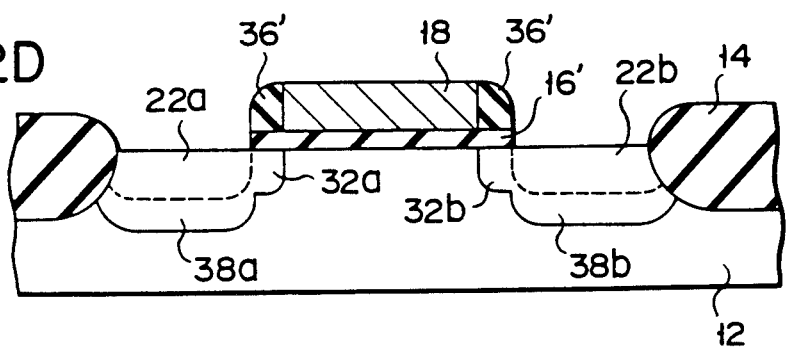

With layers 18 and 36' as a mask, an n type impurity, for example, arsenic, is ion implanted into the substrate, preferably at an acceleration voltage of 40 KeV and at a dose of $5 \times 10^{15}$ cm$^{-2}$. As a result, heavily doped n+ type semiconductor layers 22a and 22b are formed, as third diffusion layers, in the overlapping regions of the first and second diffusion layers 32 and 38, in such a manner as to and have substantially the same depth as that of the first diffusion layer 32 as shown in FIG. 2D.

The resultant layer structure is subjected to thermal oxidation to activate first, second and third diffusion layers 32, 38 and 22 in substrate 12. By so doing, a source layer and drain layer are obtained, noting that the source layer is comprised of heavily doped n+ semiconductor layer 22a and lightly doped n− semiconductor layer 24a (corresponding to first and second diffusion layers 32a and 38a) of a step-like cross-section. The drain layer is comprised of heavily doped n+ semiconductor layer 22b and lightly doped n− semiconductor layer 24b (corresponding to first and second diffusion layers 32b and 38b) of a step-like cross-section.

Figure 2E:
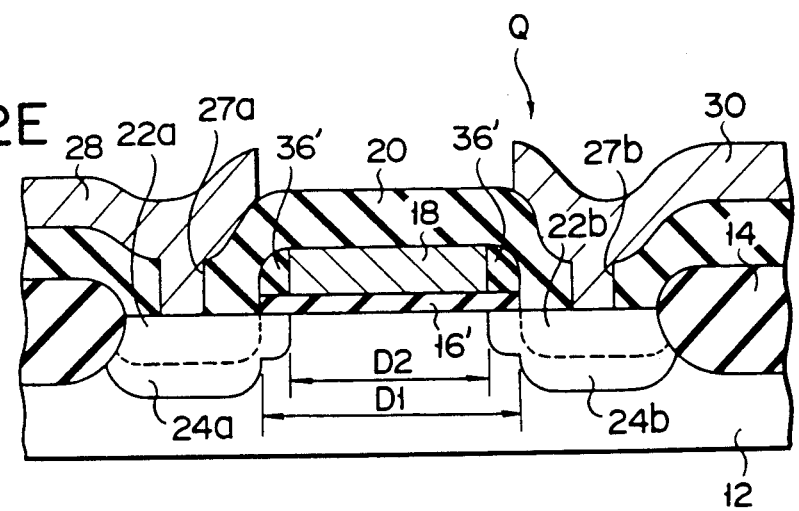

Oxide film 20 is formed by the CVD method over the entire surface of the resultant structure and contact holes 27a and 27b of the source and drain layers, respectively, are formed in CVD oxide layer 20, by a known patterning technique, as shown in FIG. 2E. Then a metal layer is formed over the entire surface of the resultant layer structure, followed by a known patterning step to provide source and drain electrode layers 28 and 30. In this way a MOSFET Q is completed which has an LDD structure. In this connection it is to be noted that lightly doped layers 32a and 38a (or 32b and 38b) as shown in FIG. 2E correspond to layer 24a (or 24b) and thus are indicated as reference numeral 24a (or 24b).

In the microminiaturized semiconductor IC device having MOSFET Q of the LDD structure, the outer low impurity concentration portions of the active layers, which are substantially self-aligned with both the ends of gate electrode layer 18, are step-like in cross-section. The distance between the source and drain layers in substrate 12 is defined by a distance D1 between dimples of active layers 24a and 24b (see FIG. 2E). The distance D1 is greater than a distance D2 between the mutually opposite active layers at the exposed surface of substrate 12. Thus, the channel length of MOSFET Q in the substrate can be increased irrespective of the fact that the transistors are very small on the order of submicron size, thus improving a punch-through voltage level Vpt. An increase in the punch-through breakdown voltage level is allowed to suppress the occurrence of the punch-through phenomenon known as short channel effect, thus improving the reliability with which the transistors are operated.

Figure 3:
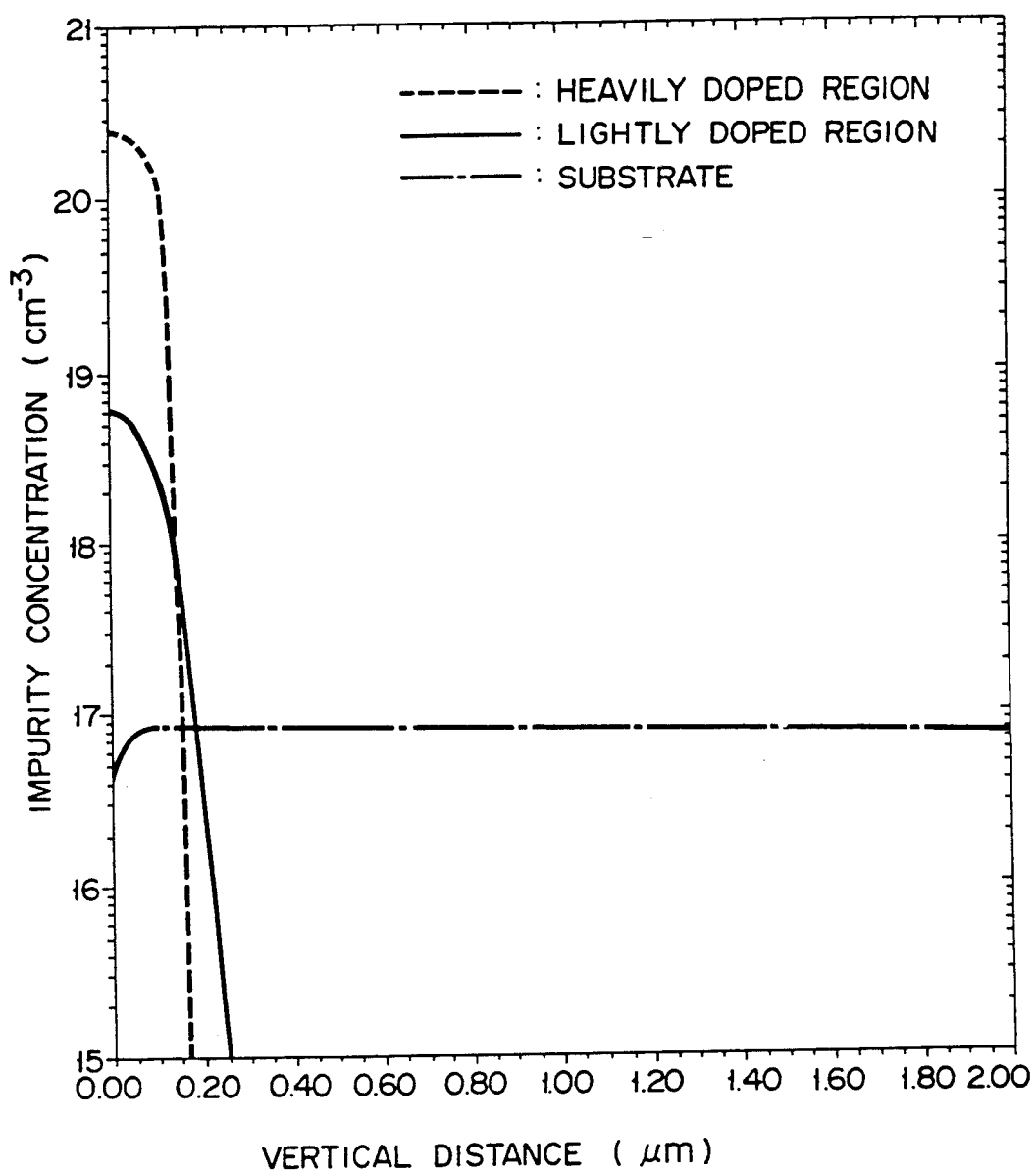
FIG. 3 is a characteristic graph showing a variation in the impurity concentration levels of an active layer (source or drain) and corresponding semiconductor substrate portion of a transistor structure of FIG. 1, as viewed in a vertical direction of the substrate.

According to this invention it is possible to increase the junction breakdown voltage at the source and drain layers, because the heavily doped region 22 of the respective active layer is completely surrounded by the lightly doped region and thus never directly connected to substrate 12 and because the lightly doped region is set at a properly small impurity concentration level. FIG. 3 shows a variation in the impurity concentration as viewed in the vertical direction of the respective active layer and corresponding substrate region. From the characteristic curve it can be seen that the impurity concentration is high in heavily doped region 22 with an abrupt change and that the impurity concentration is low at the lightly doped region with a relatively gentle change. Thus, the variation in impurity concentration between the respective active layer and the substrate is alleviated due to the presence of the lightly doped region. In this example, heavily doped layer 22 is set at an impurity concentration level of $2 \times 10^{20} cm^{-3}$, lightly doped layer 24 is set at an impurity concentration level of $6 \times 10^{18} cm^{-3}$, and substrate 12 is set at an impurity concentration level of $8 \times 10^{16} cm^{-3}$. Thus the conventional conflicting technical problems, that is, the suppression of the punch-through phenomenon and improvement of the junction breakdown voltage can be solved at once.

According to the aforementioned manufacturing method, lightly doped layers 32 and 38 of the respective active layer are separately formed by diffusion in substrate 12 in two-step process. More specifically, as shown in FIG. 2C, first diffusion layer 32 is first formed and then second diffusion layer 38 is so formed by a separate ion implantation process as to overlap first diffusion layer 32. Thus the respective active layer can be made step-like in cross-section without any specific manufacturing technique and, moreover, the microminiaturized MOSFETs of an excellent property can be fabricated by a currently available manufacturing technique. It is, therefore, possible to manufacture the microminiaturized MOSFETs in high yield and in high productivity.

Although this invention has been described with reference to the specific embodiment it shall be understood by those skilled in the art that numerous modifications may be made within the spirit and scope of the inventive contribution.

For example, the first through third diffusion layers of the source and drain regions can be formed by properly changing the order in which they are formed. The conditions under which the first through third diffusion layers are formed can be varied without departing from this invention. Although, in this embodiment, the source and drain regions have the same structure, if the diffusion layer structure is applied to the drain region side alone, substantially the same effect can also be obtained since the impact ionization and junction breakdown voltage occur on the side of the drain region to which a reverse voltage is mainly applied.

Although this invention has been explained in connection with the n-channel MOSFETs, it can, of course, be applied to not only p-channel MOSFETs but also a CMOS structure. The MOSFETs may include a structure using a thermal oxidation film as a gate insulating film or the other insulating films including, for example, a silicon nitride film.

What is claimed is:

1. A method for fabricating a field effect transistor having a lightly doped drain structure, wherein a drain layer comprises a heavily doped semiconductor layer and a lightly doped semiconductor layer formed to surround said heavily doped semiconductor layer in a semiconductor substrate of a first conductivity type, said method comprising the steps of:
   (a) forming a conductive layer which is insulatively provided above said substrate to serve as a gate electrode of the transistor; and
   (b) performing ion implantations a plurality of times to provide, in said substrate, semiconductor active layers of second conductivity type serving as source and drain layers of said transistor, said ion implantations including,
   implementing semiconductor impurity of the second conductivity type into said substrate at a first acceleration voltage and at a selected dose to form a first diffusion layer substantially self-aligned with said conductive layer, and
   separately implanting the same semiconductor impurity of the second conductivity type into said substrate at a second acceleration voltage higher than the first acceleration voltage and at the selected dose to provide in said substrate a second diffusion layer which is deeper than said first diffusion layer, overlaps said first diffusion layer, and has substantially the same impurity concentration as said first diffusion layer, said first and second diffusion layers constituting said lightly doped semiconductor layer, thereby causing said lightly doped semiconductor layer to have a step-like cross-section;
   wherein said first diffusion layer is formed with said conductive layer as a mask, and said second diffusion layer is formed with said conductive layer and insulating layer portions, positioned at both sides of said conductive layer, as a mask.

2. The method according to claim 1, wherein the second acceleration voltage is higher than at least several times the first acceleration voltage.

3. The method according to claim 1, wherein semiconductor impurities of the second conductivity type are implanted into said substrate with said conductive layer and said insulating layer portions as a mask, thereby forming a third diffusion layer serving as said heavily doped semiconductor layer, said third diffusion layer being shallower than said second diffusion layer such that said third diffusion layer is fully surrounded by said lightly doped semiconductor layer formed of said first and second diffusion layers.

4. The method according to claim 1, wherein semiconductor impurities of the second conductivity type are further implanted into an overlapping region of said first and second diffusion layers with said conductive layer and said insulating layer portions as a mask, thereby forming a third diffusion layer serving as said heavily doped semiconductor layer, said third diffusion layer being shallower than said second diffusion layer such that said third diffusion layer is fully surrounded by said lightly doped semiconductor layer formed of said first and second diffusion layers.

* * * * *